(12) United States Patent
Hayasaka et al.

(10) Patent No.: US 8,102,459 B2
(45) Date of Patent: Jan. 24, 2012

(54) IMAGE PICKUP APPARATUS

(75) Inventors: Kengo Hayasaka, Tokyo (JP); Kenji Yamamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 316 days.

(21) Appl. No.: 12/318,639

(22) Filed: Jan. 5, 2009

(65) Prior Publication Data

US 2009/0190024 A1 Jul. 30, 2009

(30) Foreign Application Priority Data

Jan. 28, 2008 (JP) ................. 2008-016716

(51) Int. Cl.
H04N 5/225 (2006.01)
(52) U.S. Cl. ...................................... 348/335
(58) Field of Classification Search ............... 348/223.1, 348/360, 241, 340, 291, 273, 65, 335; 250/208.1
See application file for complete search history.

(56) References Cited

U.S. PATENT DOCUMENTS

| | | | | |
|---|---|---|---|---|
| 6,137,535 A | * | 10/2000 | Meyers | 348/340 |
| 6,476,851 B1 | * | 11/2002 | Nakamura | 348/65 |
| 2005/0206753 A1 | * | 9/2005 | Sakurai et al. | 348/241 |
| 2008/0173791 A1 | * | 7/2008 | Palum | 250/208.1 |

FOREIGN PATENT DOCUMENTS

| | | |
|---|---|---|
| JP | 2006-048659 A | 2/2006 |
| JP | 2007-316521 A | 12/2007 |
| WO | WO-2006/039486 A2 | 4/2006 |
| WO | WO-2006/137481 A1 | 12/2006 |
| WO | WO-2007/044725 A2 | 4/2007 |
| WO | WO-2007/115281 A1 | 10/2007 |

OTHER PUBLICATIONS

R. Ng et al., "Light Field Photography with a Hand-held Plenoptic Camera", Stanford Tech Report CTSR Feb. 2005, pp. 1-11.
Extended European Search Report issued Jan. 31, 2011 for corresponding European Application No. 09 15 1492.
Adelson, E. H. et al "Single Lens Stereo With a Plenoptic Camera" IEEE Transactions on Pattern Analysis and Machine Intelligence, IEEE Service Center, Los Alamitos, CA US., vol. 14, No. 2, Feb. 1, 1992, pp. 99-106, XP000248474, ISSN: 0162-8828, DOI: DOI: 10, 1109/34 121783.
Japanese Office Action issued Sep. 22, 2011 for corresponding Japanese Application No. 2008-016716.

* cited by examiner

Primary Examiner — David Ometz
Assistant Examiner — Akshay Trehan
(74) Attorney, Agent, or Firm — Rader, Fishman & Grauer PLLC

(57) ABSTRACT

An image pickup apparatus includes: an image pickup lens section having an aperture stop; an image pickup device obtaining image pickup data on the basis of light detected; and a microlens array section arranged on a focal plane of the image pickup lens section, and including a plurality of microlenses, each of the microlenses being provided corresponding to a plurality of image pickup pixels of the image pickup device, wherein the following formula (1) is satisfied:

$$p = (m \times s) \times \{L/(L+f)\} \quad (1)$$

where p is a pitch between the microlenses, s is a pixel size in a predetermined direction, m is the number (an integer) of the image pickup pixels allocated to each of the microlenses in the predetermined direction, L is a distance between the aperture stop and the microlens array section, and f is a focal length of each of the microlenses.

4 Claims, 11 Drawing Sheets

IMAGE PICKUP APPARATUS

CROSS REFERENCES TO RELATED APPLICATIONS

The present invention contains subject matter related to Japanese Patent Application JP 2008-016716 filed in the Japanese Patent Office on Jan. 28, 2008, the entire contents of which being incorporated herein by reference.

BACKGROUND OF THE INVENTION

1. Field of the Invention

The present invention relates to an image pickup apparatus using a microlens array.

2. Description of the Related Art

Various image pickup apparatuses have been proposed and developed. An image pickup apparatus performing predetermined image processing on image pickup data obtained by picking up an image to output the processed image pickup data has been also proposed.

For example, International Patent Publication No. 06/039486 and Ren. Ng, et al. "Light Field Photography with a Hand-Held Plenoptic Camera", Stanford Tech Report CTSR 2005-02, propose image pickup apparatuses using a technique called "Light Field Photography". Such an image pickup apparatus includes an image pickup lens, a microlens array, an image pickup device and an image processing section, and an aperture stop including a single aperture in its central part is included in the image pickup lens. In such a configuration, image pickup data obtained by the image pickup device includes the intensity distribution of light on a light-sensing plane as well as information on the traveling direction of the light. Thereby, the image processing section is capable of reconstructing or reproducing an image viewed from an arbitrary viewpoint or an arbitrary direction (hereinafter simply referred to as a field of view).

SUMMARY OF THE INVENTION

In the above-described microlens array, a plurality of microlenses are arranged, and a plurality of pixels of the image pickup device are allocated to each microlens. In the case where the above-described technique is used, the number of pixels in a reconstructed image is equal to the number of microlenses in the microlens array, because information on the two-dimensional coordinates of the reconstructed image is determined by the coordinates of the microlens array. Therefore, the number of pixels in the two-dimensional coordinates of the reconstructed image is equal to the number determined by dividing the total number of pixels of the image pickup device by the number of pixels allocated to each microlens. On the other hand, the number of pixels allocated to each microlens is equal to the resolution of the angular information of a light ray, and determines the resolution in an arbitrary field of view of the reconstructed image, that is, determines the number of viewpoints or directions from which an image is reconstructed. Therefore, there is a trade-off relationship between the resolution in the arbitrary field of view and the number of pixels in two-dimensional coordinates.

In this case, in the case where the above-described technique is used, the image pickup data includes the intensity distribution of light as well as the information on the traveling direction of the light, so it is important to describe each light ray separately. However, in the technique, the pitch between images each corresponding to each of microlenses (images formed by projecting an aperture stop of a main lens, for example, circular images) which are formed on an image pickup device changes depending on the position of the aperture stop of the main lens. In other words, the number of pixels allocated to each microlens changes. Therefore, in some cases, depending on the position of the aperture stop, it is difficult to obtain a reconstructed image such as a refocused image and the arbitrary viewpoint image as an image unique to the above-described technique.

It is desirable to provide an image pickup apparatus capable of forming an appropriate reconstructed image in the case where image pickup data including information on the traveling direction of light is obtained.

According to an embodiment of the invention, a first image pickup apparatus including: an image pickup lens section having an aperture stop; an image pickup device obtaining image pickup data on the basis of light detected; and a microlens array section arranged on a focal plane of the image pickup lens section between the image pickup lens section and the image pickup device, and including a plurality of microlenses, each of the microlenses being provided corresponding to a plurality of image pickup pixels of the image pickup device, wherein the following formula (1) is satisfied:

$$p = (m \times s) \times \{L/(L+f)\} \quad (1)$$

where p is a pitch between the microlenses, s is a pixel size in a predetermined direction, m is the number (an integer) of the image pickup pixels allocated to each of the microlenses in the predetermined direction, L is a distance between the aperture stop and the microlens array section, and f is a focal length of each of the microlenses.

In the first image pickup apparatus according to the embodiment of the invention, an image of an object subjected to image pickup by the image pickup lens section is formed on the microlens array section. Then, a light ray entering into the microlens array section reaches the image pickup device, and is detected by a plurality of image pickup pixels allocated to each of the microlenses, thereby image pickup data including information on the traveling direction of light is obtained. In this case, when the pitch between the microlenses satisfies the above-described formula, image height deviation in a light-sensing plane of the image pickup device is prevented from occurring in image pickup data obtained by the image pickup device.

According to an embodiment of the invention, there is provided a second image pickup apparatus including: an image pickup lens section having an aperture stop; an image pickup device obtaining image pickup data on the basis of light detected; a microlens array section arranged on a focal plane of the image pickup lens section between the image pickup lens section and the image pickup device, and including a plurality of microlenses, each of the microlenses being provided corresponding to a plurality of image pickup pixels of the image pickup device; and an image height correction section performing image height correction on the image pickup data obtained by the image pickup device so that an image size, in a predetermined direction, of an image formed on the image pickup device by a single microlens is equal to an integral multiple of a pixel size, in the predetermined direction, of the image pickup pixel.

In the second image pickup apparatus according to the embodiment of the invention, an image of an object subjected to image pickup by the image pickup lens section is formed on the microlens array section. Then, a light ray entering into the microlens array reaches the image pickup device, and is detected by a plurality of image pickup pixels allocated to each of the microlenses, thereby image pickup data including information on the traveling direction of light is obtained. In this case, the image height correction section performs image height correction on the image pickup data obtained by the image pickup device so that an image size, in a predetermined direction, of an image formed on the image pickup device by a single microlens is equal to an integral multiple of a pixel size, in the predetermined direction, of the image pickup pixel, so irrespective of the position of the aperture stop, image height deviation in a light-sensing plane of the image pickup device is prevented from occurring in image pickup data obtained by performing such image height correction.

In the first image pickup apparatus according to the embodiment of the invention, the pitch between the microlenses satisfies the above-described formula, so image height deviation in the light-sensing plane of the image pickup device may be prevented from occurring in image pickup data obtained by the image pickup device. Therefore, when a reconstructed image is formed through the use of such image pickup data, in the case where image pickup data is obtained so as to include information on the traveling direction of light, an appropriate reconstructed image may be formed.

Moreover, in the second image pickup apparatus according to the embodiment of the invention, the image height correction section performs image height correction on the image pickup data obtained by the image pickup device so that an image size, in the predetermined direction, of an image formed on the image pickup device by a single microlens is equal to an integral multiple of a pixel size, in the predetermined direction, of the image pickup pixel, so irrespective of the position of the aperture stop, image height deviation in a light-sensing plane of the image pickup device may be prevented from occurring in image pickup data obtained by performing image height correction. Therefore, when a reconstructed image is formed through the use of image pickup data obtained by performing the image height correction, in the case where image pickup data is obtained so as to include information on the traveling direction of light, irrespective of the position of an aperture stop of a main lens, an appropriate reconstructed image may be formed.

Other and further objects, features and advantages of the invention will appear more fully from the following description.

DETAILED DESCRIPTION OF THE PREFERRED EMBODIMENTS

Preferred embodiments of the invention will be described in detail below referring to the accompanying drawings.

First Embodiment

Figure 1:
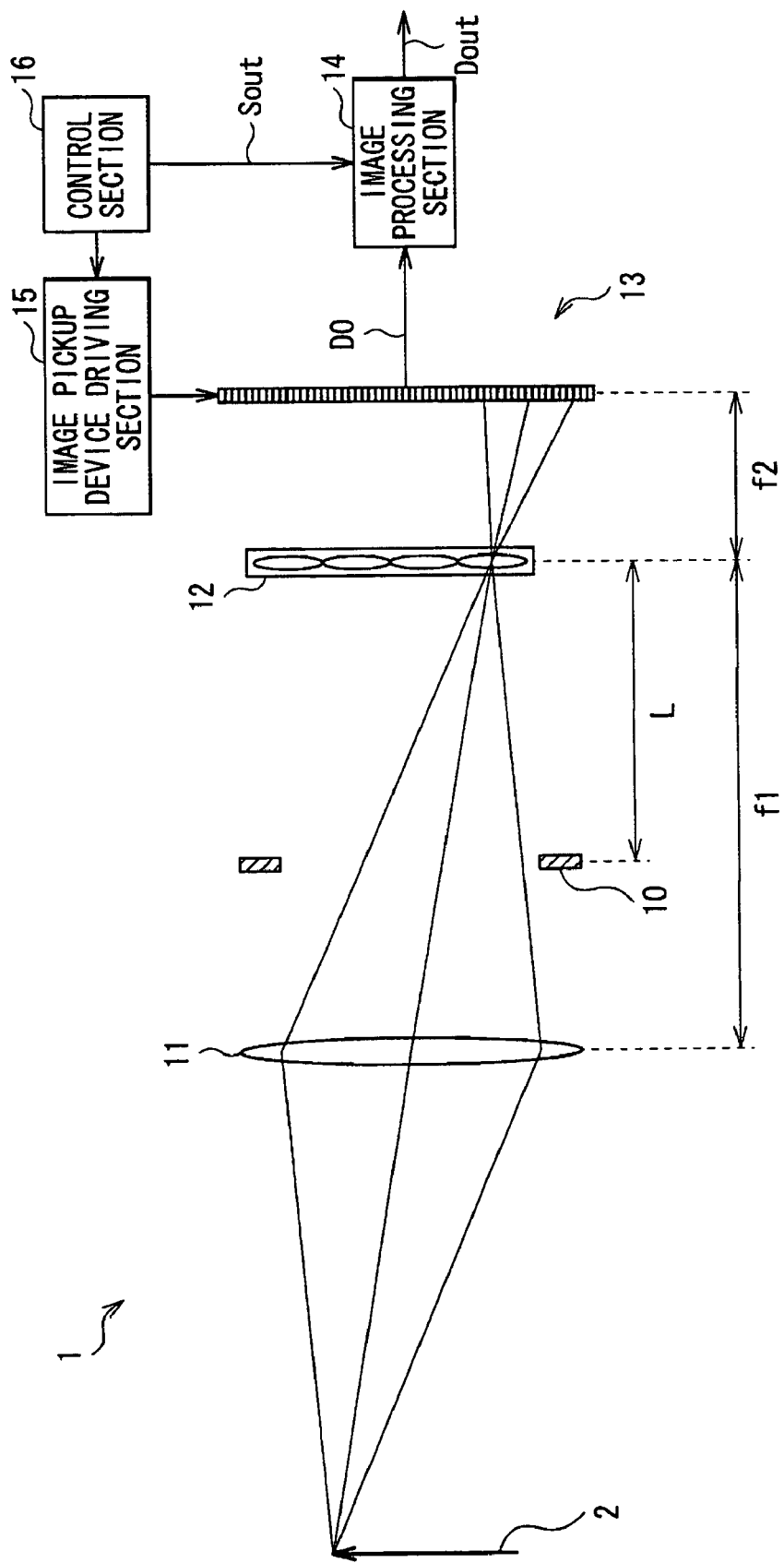
FIG. 1 is an illustration of the whole configuration of an image pickup apparatus according to a first embodiment of the invention.

FIG. 1 illustrates the whole configuration of an image pickup apparatus (an image pickup apparatus 1) according to a first embodiment of the invention. The image pickup apparatus 1 picks up an image of an object 2 to output image pickup data Dout. The image pickup apparatus 1 includes an image pickup lens 11, an aperture stop 10, a microlens array 12 and an image pickup device 13 in order from a side closer to the object 2. The image pickup apparatus 1 also includes an image processing section 14, an image pickup device driving section 15 and a control section 16.

The image pickup lens 11 is a main lens for picking up an image of an object, and includes, for example, a typical image pickup lens used in a video camera, a still camera or the like.

Figure 2:
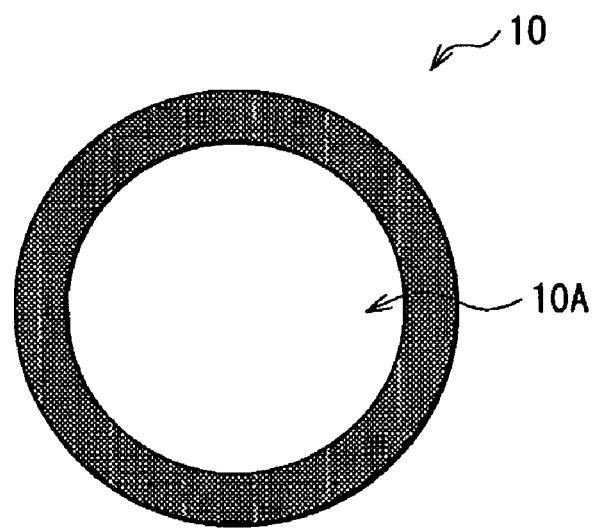
FIG. 2 is a schematic plan view of an aperture stop illustrated in FIG. 1.

The aperture stop 10 is an optical aperture stop of the image pickup lens 11. For example, as illustrated in FIG. 2, the aperture stop 10 has one circular aperture section 10A in its central part. Thereby, as will be described in detail later, all light rays passing through the aperture stop 10A keep information on the traveling direction thereof. The aperture stop 10 and the microlens array 12 are arranged to have a distance L therebetween.

Figure 3:
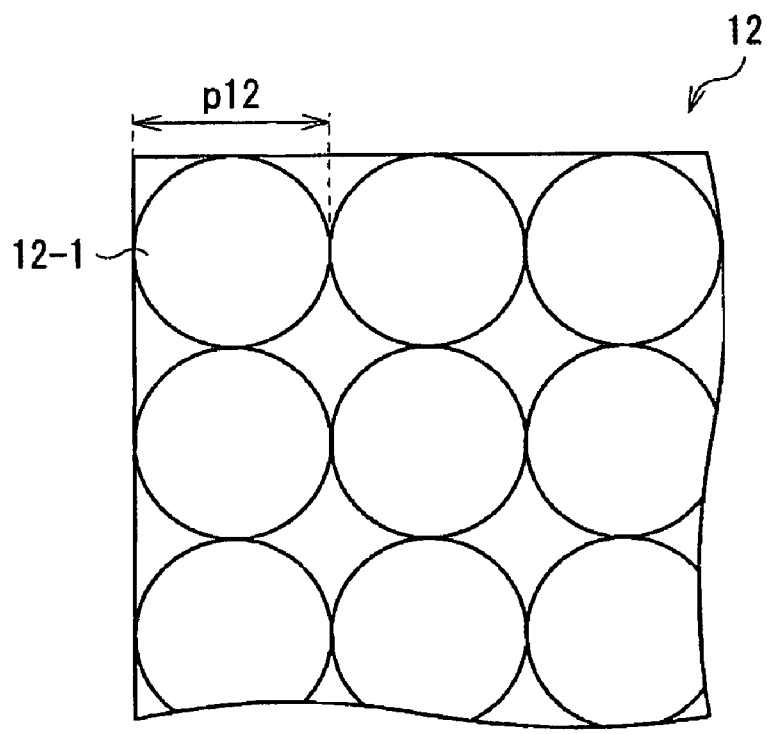
FIG. 3 is a schematic plan view of a microlens array illustrated in FIG. 1.

For example, as illustrated in FIG. 3, in the microlens array 12, a plurality of microlenses 12-1 are two-dimensionally arranged in a matrix form (the pitch between the microlenses 12-1: p12), and the microlens array 12 is arranged on an image forming plane of the image pickup lens 11 (a reference numeral f1 in the drawing donates the focal length of the image pickup lens 11). The planar shape of each microlens 12-1 is circular, and each microlens 12-1 is made of, for example, a liquid crystal lens, a liquid lens, a diffractive lens or the like.

In the microlens array 12, when the pitch between the microlenses 12-1 is "p12" as described above, when the pixel size in a predetermined direction of an image pickup pixel (a pixel P which will be described later) of the image pickup device 13 is "s", when the number of pixels P allocated to each microlens 12-1 in the predetermined direction is "m" (an integer), when a distance between the aperture stop 10 and the microlens array 12 as described above is "L", and when the focal length of each of the microlenses is "f2", the pitch p12 between the microlenses 12-1 is represented by the following formula (11). Thereby, as will be described in detail later, in image pickup data (image pickup data D0 which will be described later) obtained by the image pickup device 13, the occurrence of image height deviation in a light-sensing plane (a plane on a side closer to the microlens array 12) of the image pickup device 13 is prevented.

$$p12=(m\times s)\times\{L/(L+f2)\} \quad (11)$$

The image pickup device 13 receives or detects light from the microlens array 12 to obtain image pickup data D0, and is arranged on the focal plane of the microlens array 12 (a reference numeral f2 in the drawing donates the focal length of each of the microlenses 12-1). The image pickup device 13 includes a two-dimensional image pickup device such as a plurality of CCDs (Charge Coupled Devices) or a plurality of CMOSs (Complementary Metal-Oxide Semiconductors) two-dimensionally arranged in a matrix form.

On the light-sensing plane (a plane closer to the microlens array 12) of such an image pickup device 13, M×N (M and N each are an integer) number of image pickup pixels (pixels P which will be described later) are two-dimensionally arranged in a matrix form, and a plurality of pixels P are allocated to one microlens 12-1 in the microlens array 12. The number of pixels P on the light-sensing plane is, for example, M×N=3720×2520=9374400. The number (m×n) of pixels allocated to each microlens 12-1 is related to the resolution in an arbitrary field of view of a reconstructed image, so the resolution in the arbitrary field of view of the reconstructed image increases with an increase in the values of m and n. On the other hand, the values of (M/m) and (N/n) are related to the number of pixels (the resolution) in the reconstructed image, so the number of pixels in the reconstructed image increases with an increase in the values of (M/m) and (N/n). Therefore, there is a trade-off relationship between the resolution in the arbitrary field of view of the reconstructed image and the number of pixels.

Figure 4:
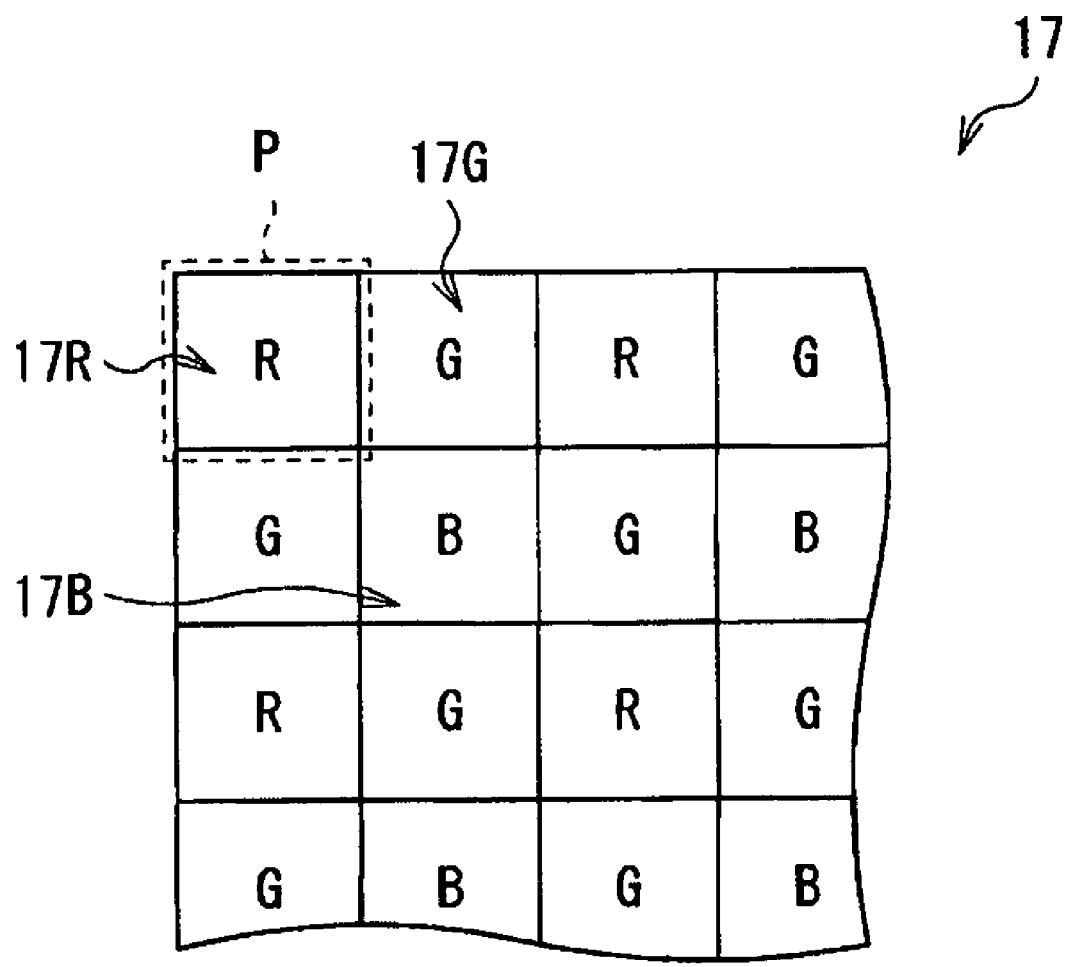
FIG. 4 is a schematic plan view of a color filter arranged on a light-sensing plane of an image pickup device.

On the light-sensing plane of the image pickup device 13, for example, a color filter 17 as illustrated in FIG. 4 is two-dimensionally arranged for each pixel P (not illustrated in FIG. 1). The color filter 17 is a color filter (a primary color filter) having a Bayer arrangement in which filters of three primary colors, that is, red (R), green (G) and blue (B) (red color filters 17R, green color filters 17G and blue color filters 17B) are arranged in a checkered pattern at a ratio of R:G:B=1:2:1. Such a color filter 17 is arranged on the light-sensing plane of the image pickup device 13, thereby the image pickup data D0 obtained by the image pickup device 13 becomes pixel data (color pixel data) of a plurality of colors (in this case, three primary colors) corresponding to the colors of the color filter 17.

The image processing section 14 performs predetermined image processing which will be described later (image processing including a sorting process) on the image pickup data D0 obtained by the image pickup device 13, and outputs image pickup data Dout obtained by performing the image processing. More specifically, for example, the image processing section 14 performs refocusing arithmetic processing utilizing a technique called "Light Field Photography". Thereby, the image processing section 14 may form an image (a reconstructed image on the basis of the image pickup data Dout) focused on an arbitrary focal point. The configuration of the image processing section 14 and the operation of refocusing arithmetic processing will be described in detail later.

The image pickup device driving section 15 drives the image pickup device 13, and controls the light-sensing operation of the image pickup device 13.

The control section 16 controls the operations of the image processing section 14 and the image pickup device driving section 15, and includes, for example, a microcomputer or the like.

Figure 5:
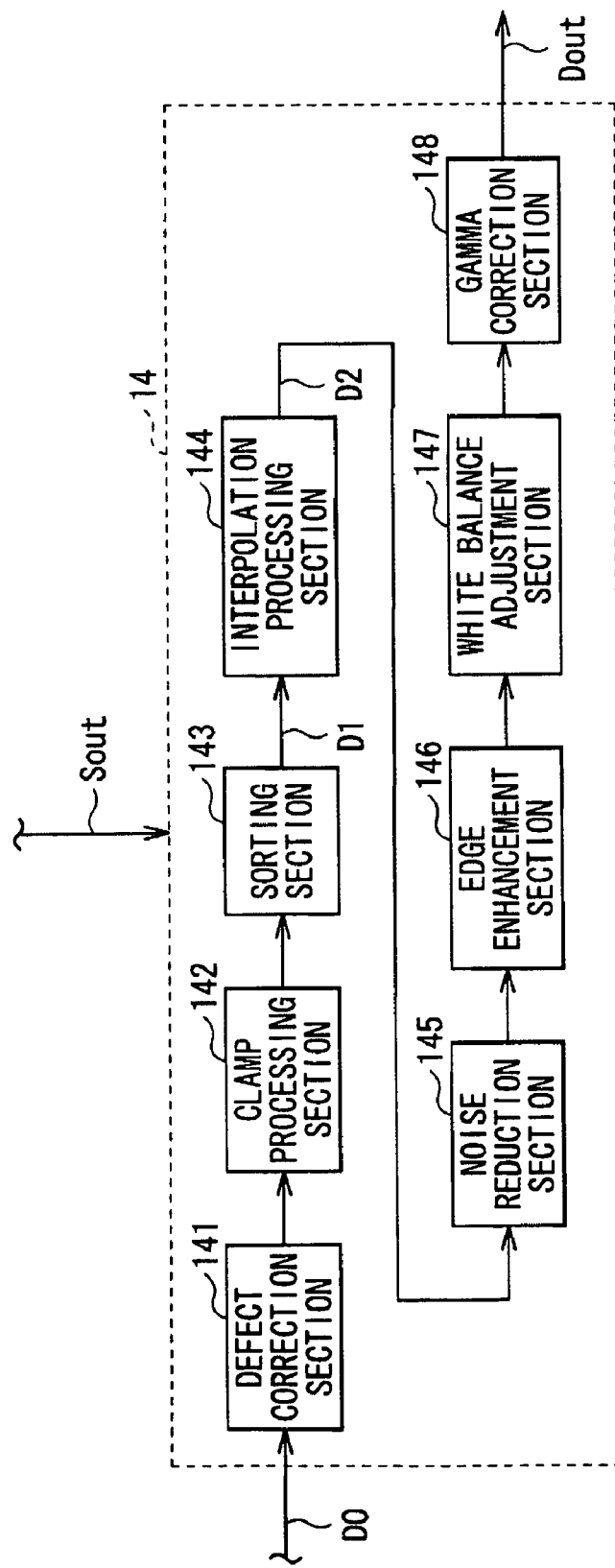
FIG. 5 is a functional block diagram of a configuration example of an image processing section illustrated in FIG. 1.

Next, the configuration of the image processing section 14 will be described in detail below referring to FIG. 5. FIG. 5 illustrates a functional block diagram of the image processing section 14.

The image processing section 14 includes a defect correction section 141, a clamp processing section 142, an interpolation processing section 143, a sorting section 144, a noise reduction section 145, an edge enhancement section 146, a white balance adjustment section 147 and a gamma correction section 148.

The defect correction section 141 corrects a defect such as loss or invalidity included in the image pickup data D0 (a defect caused by an abnormality in the image pickup device 13). The clamp processing section 142 performs a process (clamp processing) of setting the black level of each pixel data on image pickup data obtained through the defect correction by the defect correction section 142.

The interpolation processing section 143 performs interpolation processing on image pickup data supplied from the clamp processing section 142, for example, a demosaic process or the like on a typical Bayer arrangement so as to obtain image pickup data D1.

The sorting section 144 performs a predetermined sorting process (a process of sorting pixel data) on the image pickup data D1 supplied from the interpolation processing section 143 so as to obtain image pickup data D2. When such a sorting process is performed, the reconstructed image focused on the above-described arbitrary focal point is formed. The operation of the sorting process by the sorting section 144 will be described in detail later.

The noise reduction section 145 performs a process of reducing noise (for example, noise generated when an image is picked up in a dark place or a place with insufficient sensitivity) included in the image pickup data D2 supplied from the sorting section 144. The edge enhancement section 146 performs an edge enhancement process, that is, a process of enhancing the edge of an image on image pickup data supplied from the noise reduction section 145.

The white balance adjustment section 147 performs a process (a white balance adjustment process) of adjusting color balance on image pickup data supplied from the edge enhancement section 146 (image pickup data adjusted or set so that the number of red pixel data, green pixel data and blue pixel data are equal to one another), where such color balance may be affected by an individual difference among devices such as a difference in spectral sensitivity of the image pickup device 13, by a difference in transmission characteristics of the color filter 17 or by illumination conditions.

The gamma correction section 148 performs predetermined gamma correction (tone or contrast correction) on image pickup data supplied from the white balance adjustment section 147 so as to obtain image pickup data Dout.

Next, referring to FIGS. 1 to 14, functions and effects of the image pickup apparatus 1 according to the present embodiment will be described in detail below.

First, referring to FIGS. 1 to 12, basic functions of the image pickup apparatus 1 will be described below.

Figure 6A:
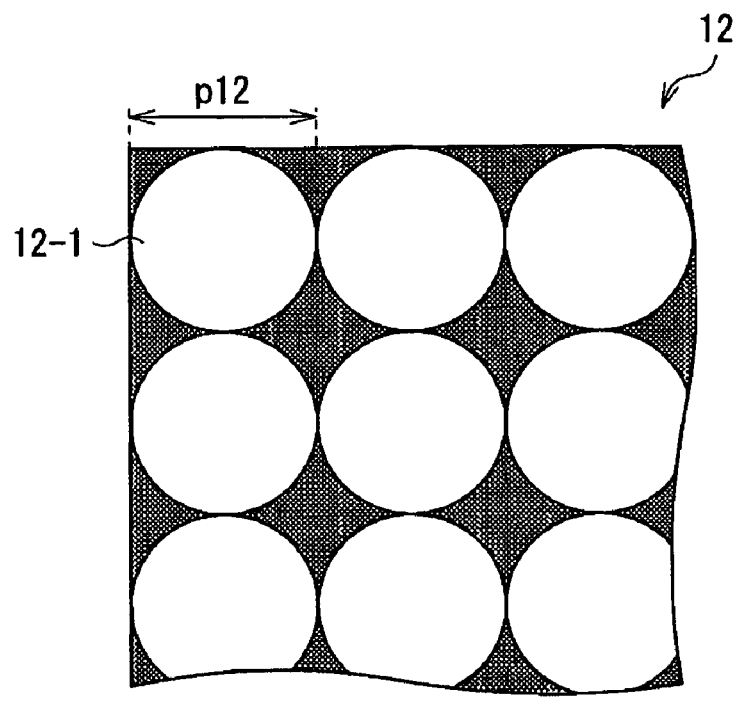
FIGS. 6A and 6B are plan views for describing image pickup patterns in the microlens array and in the image pickup device.
Figure 6B:
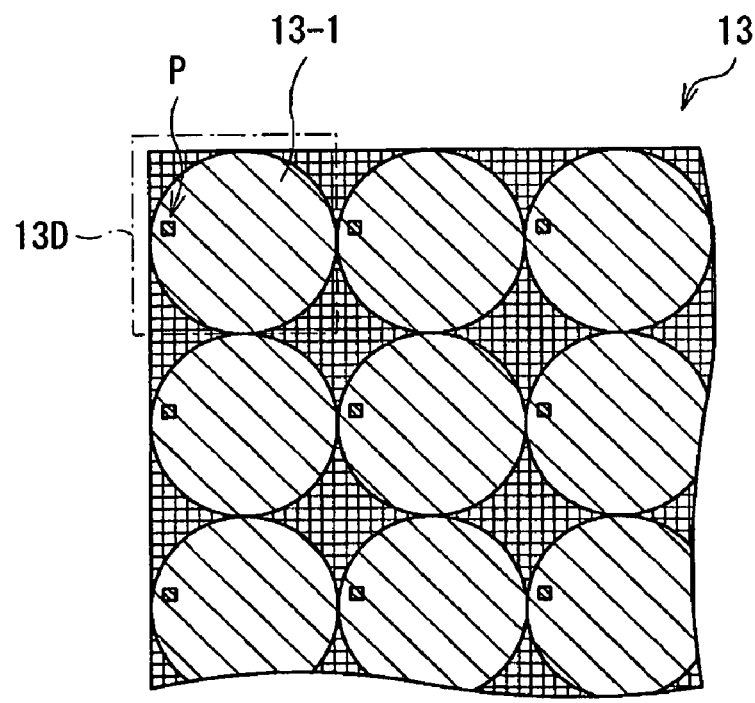

In the image pickup apparatus 1, an image of the object 2 by the image pickup lens 11 is formed on the microlens array 12 in accordance with the shape (the circular shape) of each microlens 12-1 as illustrated in FIG. 6A, for example. Then, an incident light ray to the microlens array 12 reaches the image pickup device 13 through the microlens array 12, and, for example, as illustrated in FIG. 6B, the incident light ray is detected by a light-sensing region 13-1 on which the circular shape of the aperture stop 10 is projected, and the image pickup data D0 is obtained by the image pickup device 13. At this time, the incident light ray to the microlens array 12 is detected in a different position in the image pickup device 13 according to the incident direction of the incident light ray. More specifically, the incident direction of the light ray is determined by the positions of the pixels P allocated to each microlens 12-1. A region (a reconstructed pixel region 13D) where the pixels P allocated to each microlens 12-1 are arranged corresponds to one pixel of the reconstructed image.

Next, the image pickup data obtained in the image pickup device 13 is inputted into the image processing section 14. Then, in the image processing section 14, predetermined image processing (for example, the above-described refocusing arithmetic processing) is performed on the image pickup data D0, thereby the image pickup data Dout obtained through the image processing is outputted as output data (image data of the reconstructed image) of the image pickup apparatus 1.

Now, referring to FIGS. 7 to 12, the basic parts of image processing operation (refocusing arithmetic processing operation) by the image processing section 14 will be described below.

Figure 7:
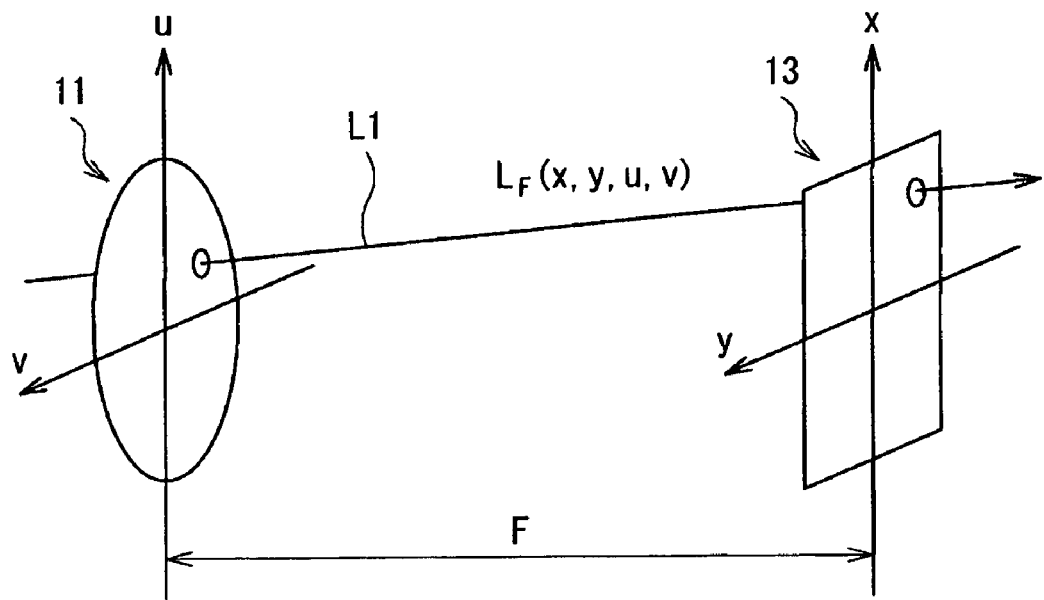
FIG. 7 is a schematic perspective view for describing an example of image processing by the image processing section.

First, as illustrated in FIG. 7, a rectangular coordinate system (u, v) is defined on an image pickup lens plane of the image pickup lens 11, and a rectangular coordinate system (x, y) is defined on an image pickup plane of the image pickup device 13. A distance between the image pickup lens plane of the image pickup lens 11 and the image pickup plane of the image pickup device 13 is defined as "F". Then, a light ray L1 passing through the image pickup lens 11 and the image pickup device 13 is represented by a four-dimensional function $L_F(x, y, u, v)$. Therefore, information on the traveling direction of the light ray L1 as well as information on the position of the light ray L1 is recorded into the image pickup device 13. In other words, the incident direction of the light ray is determined by the arrangement of the plurality of pixels P allocated to each microlens 12-1.

Figure 8:
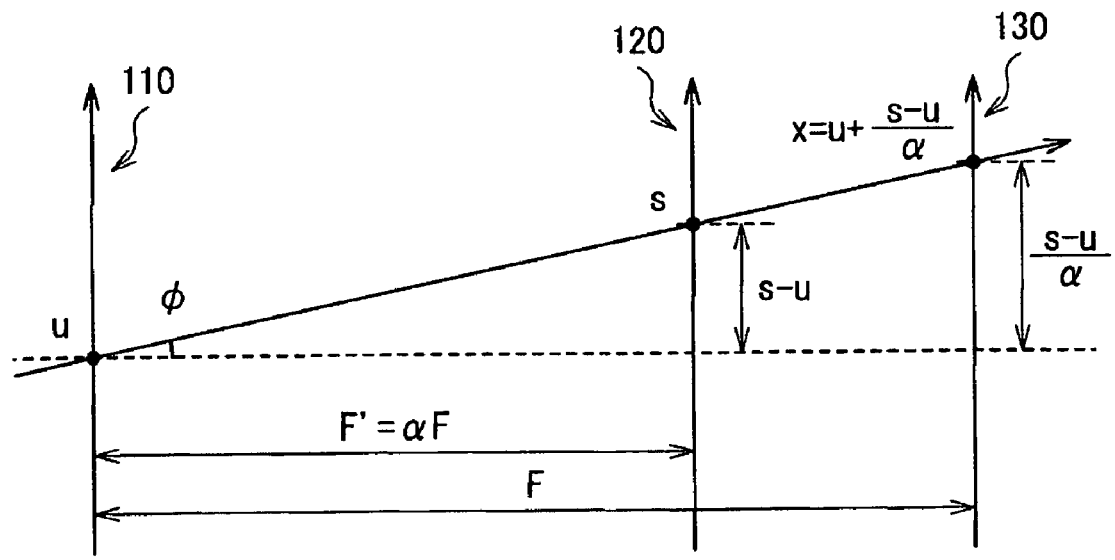
FIG. 8 is a schematic sectional view for describing refocusing arithmetic processing by the image processing section.

Also, as illustrated in FIG. 8, in the case where a positional relationship among an image pickup lens plane 110, an image pickup plane 130 and a refocus plane 120 is determined (the refocus plane 120 is determined so as to establish F'=αF), detection intensity $L_{F'}$ on the image pickup plane 130 of coordinates (s, t) on the refocus plane 120 is represented by the following formula (12). Moreover, an image $E_{F'}(s, t)$ obtained on the refocus plane 120 is a value obtained by integrating the above-described detection intensity $L_{F'}$ with respect to a lens aperture, so the image $E_{F'}(s, t)$ is represented by the following formula (13). Therefore, when a refocusing arithmetic operation is performed on the basis of the formula (13), on the basis of the image pickup data Dout obtained through the image processing, an image focused on an arbitrary focal point (the refocus plane 120) is reconstructed.

Mathematical Formula 1

More specifically, in the image processing section 14, as illustrated in FIG. 5, the defect correction section 141 corrects a defect in the image pickup data D0 supplied from the image pickup device 13, and the clamping processing section 142 performs clamp processing on the image pickup data D0. Then, the interpolation processing section 143 performs interpolation processing on the image pickup data D0, and the sorting section 144 performs the sorting process of the pixel data D1. Thereby the image pickup data D2 is produced from the image pickup data D1.

Figure 9:
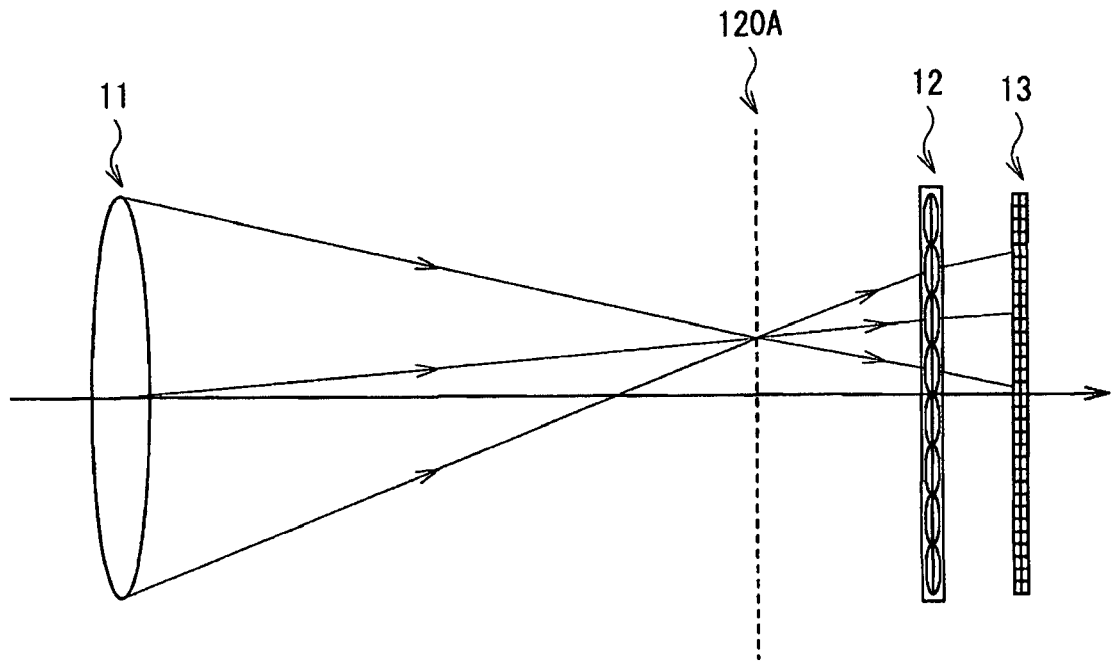
FIG. 9 is a schematic sectional view of an example of a determined position of a refocus plane in the refocusing arithmetic processing.
Figure 11:
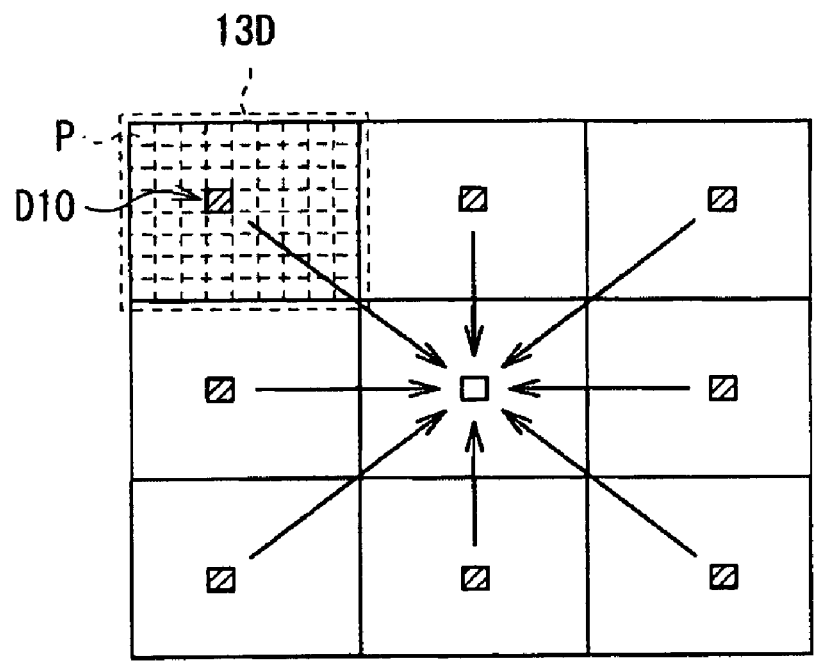
FIG. 11 is a schematic plan view of an example of a sorting process in the refocusing arithmetic processing illustrated in FIG. 9.

In this case, when a reconstructed image of which the focal point position is determined at the back of (i.e., on a farther side than) a focal point position (the position of the microlens array 12) determined when photographing is carried out is to be formed by the refocusing arithmetic processing by the image processing section 14, a sorting process in which, for example, a light ray illustrated in FIG. 9 is selectively extracted is performed. In other words, an image of which the focal point position is determined at the back of the focal point position determined at the time of the photographing is formed between the image pickup lens 11 and the microlens array 12. Thus, the light ray which is once condensed is dispersed again, and passes through a different microlens array depending on its traveling direction to reach the image pickup device 13. Therefore, for example, as illustrated in FIG. 11, a process of sorting each pixel data is performed such that pixel data D10 corresponding to such a light ray is selectively extracted from a plurality of mutually-different reconstructed pixel regions 13D.

Figure 10:
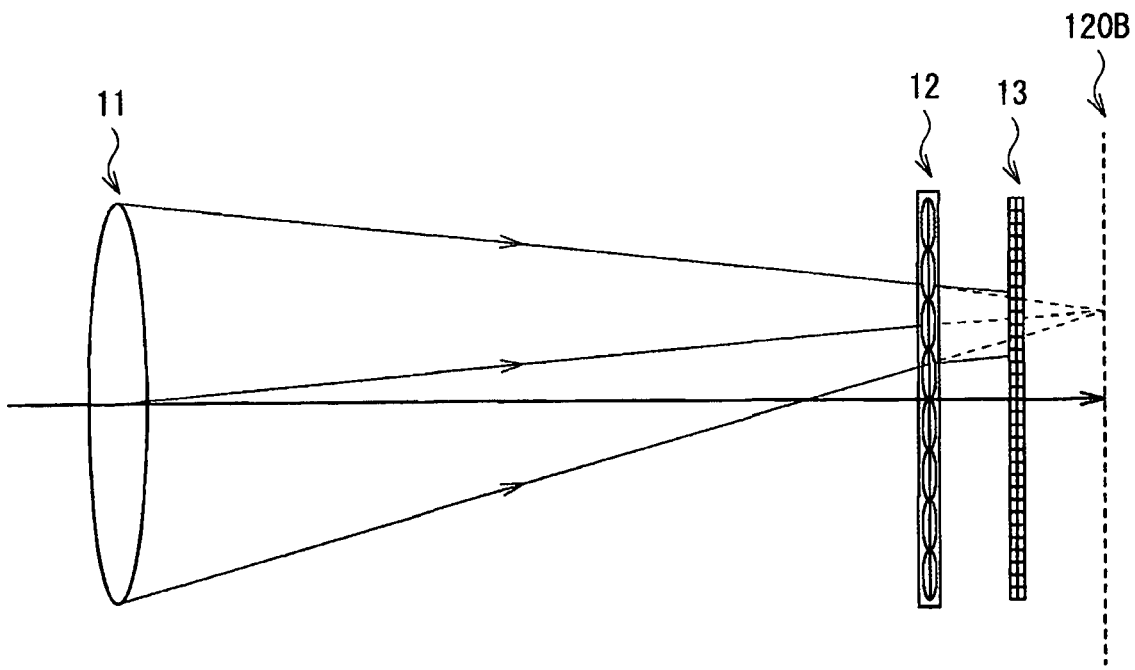
FIG. 10 is a schematic sectional view of another example of the determined position of the refocus plane in the refocusing arithmetic processing.
Figure 12:
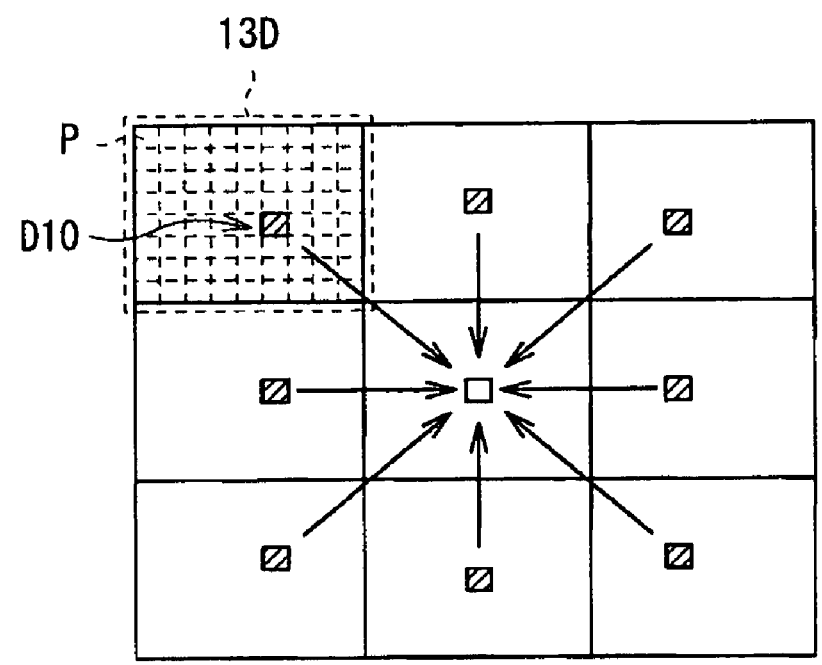
FIG. 12 is a schematic plan view of another example of the sorting process in the refocusing arithmetic processing illustrated in FIG. 10.

On the other hand, when a reconstructed image of which the focal position point is determined in front of (i.e., on a closer side than) the focal point position (the position of the microlens array 12) determined when photographing is carried out is to be formed by the refocusing arithmetic processing by the image processing section 14, a sorting process in which, for example, a light ray represented in FIG. 10 is selectively extracted is performed. In other words, an image of which the focal position point is determined in front of the focal point position determined at the time of the photographing is formed behind the microlens array 12. Thus, the image is not formed in the image pickup apparatus 1, and the light ray passes through a different microlens array depending on its traveling direction to reach the image pickup device 13. Therefore, for example, as illustrated in FIG. 12, a sorting process of each pixel data is performed such that pixel data D10 corresponding to such a light ray is selectively extracted from a plurality of mutually-different reconstructed pixel regions 13D.

Next, as illustrated in FIG. 5, the noise reduction section 145 further performs a noise reduction process on the image pickup data D2 obtained through such a sorting process, and the edge enhancement section 146 performs the edge enhancement process on the image pickup data D2, and then the image pickup data D2 is supplied to the white balance adjustment section 147. Thereby, image pickup data of which color balance is adjusted is obtained. Then, the gamma correction section 148 performs the gamma correction on the image pickup data supplied from the white balance adjustment section 147, thereby the image pickup data is outputted from the image processing section 14 as the image pickup data Dout. Thereby, an image focused on an arbitrary focal point (the refocus plane 120) is reconstructed on the basis of the image pickup data Dout.

Figure 13:
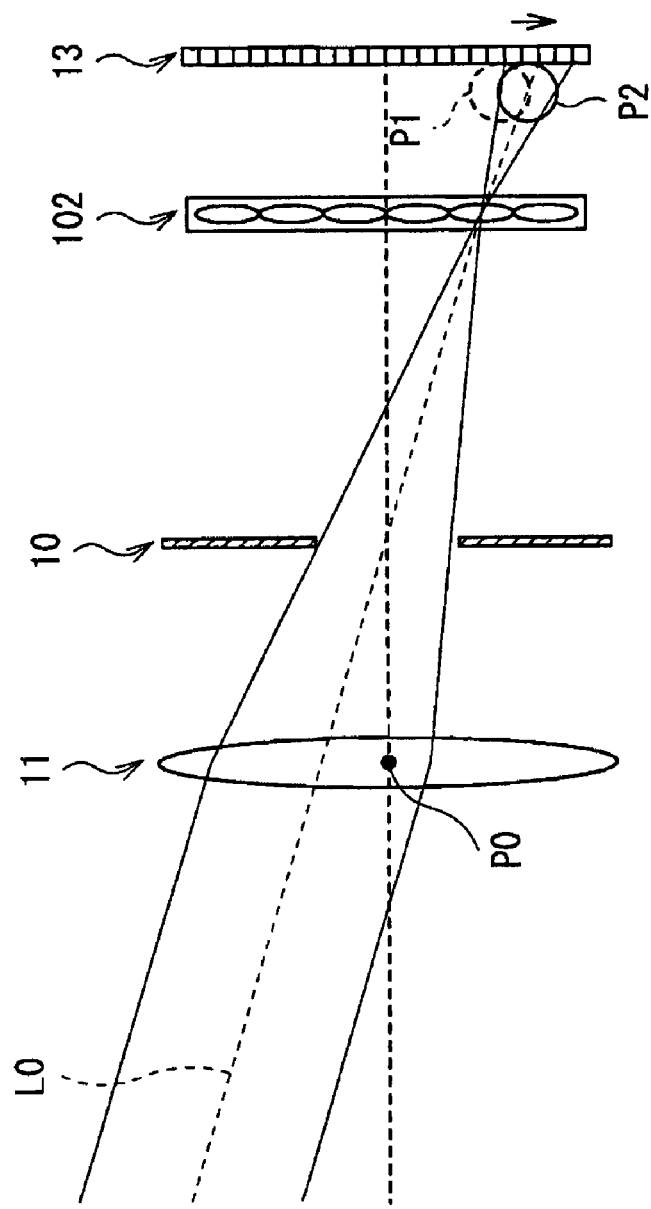
FIG. 13 is an illustration for describing image height deviation in an image pickup apparatus according to a comparative example.
Figure 14:
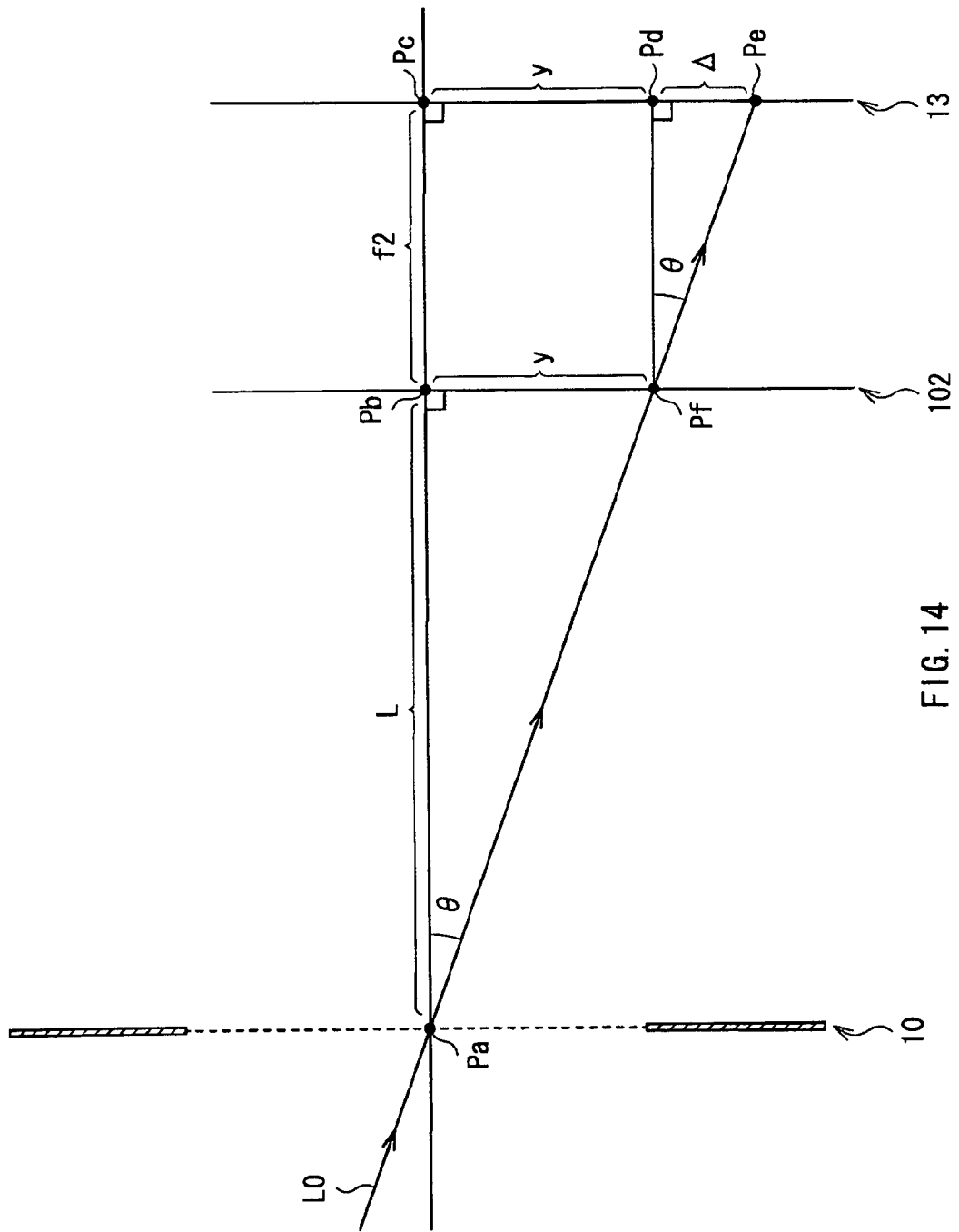
FIG. 14 is a schematic view for describing the image height deviation in the image pickup apparatus according to the comparative example.

Next, referring to FIGS. 13 and 14, characteristic functions of the image pickup apparatus according to the present embodiment will be described in detail in comparison with a comparative example. FIGS. 13 and 14 illustrate a state of image pickup in the case where image height deviation occurs (the case of the image height deviation amount Δ>0) in an image pickup apparatus according to the comparative example (including a microlens array 102 in which the pitch p12 between the microlenses 12-1 does not satisfy the above-described formula (1), instead of the microlens array 12 in the image pickup apparatus 1).

First, for example, as illustrated in FIG. 13, in the case where the position of the aperture stop 10 of the image pickup lens 11 as a main lens has some distance from a principal point P0 of the image pickup lens 11, when a main light ray L0 of incident light into the microlens array 12 is inclined with respect to an optical axis to some extent (in the case where the main light ray L0 is not present on the principal point P0 of the image pickup lens 11), the pitch between images (unit images) formed on the image pickup device 13 in accordance with the shapes (circular shapes) of the microlenses 12-1 is shifted from a position P1 to a position P2 as indicated by an arrow in the drawing, depending on the position of the aperture stop 10.

Thereby, for example, as illustrated in FIG. 14, the image height deviation by an image height deviation amount Δ (a distance between a point Pd and a point Pe) occurs in the light-sensing plane (a plane on a side closer to the microlens array 12) of the image pickup device 13. The image height deviation amount Δ is represented by the following formulas (14) and (15), where an inclined angle between the optical axis and the main light ray L0 is "θ", an image height (a distance between a point Pb and a point Pf) of an image of the main light ray L0 formed on the microlens array 102 is "y", a distance between the aperture stop 10 and the microlens array 12 (a distance between a point Pa and the point Pb) is "L", and the focal length of each of the microlenses 12-1 (a distance between the point Pb and a point Pc) is "f2". Moreover, a ratio between the image height y on the microlens array 12 and the image height of a unit image formed on the image pickup device 13 (a distance between the point Pc and the point Pe) is represented by the following formula (16).

$$\tan \theta = (y/L) = (\Delta/f2) \quad (14)$$

$$\Delta = \{(y \times f2)/L\} \quad (15)$$

$$(y+\Delta)/y = (L+f2)/L \quad (16)$$

Thus, in the image pickup apparatus according to the comparative example illustrated in FIGS. 13 and 14, since the pitch p12 between the microlenses 12-1 in the microlens array 102 does not satisfy the above-described formula (11), the image height deviation by the image height deviation amount Δ represented by the above-described formulas (14) and (15) consequently occurs. In other words, as described above, even in the case where the image pickup data D0 obtained by the image pickup device 13 includes information on the traveling direction of light as well as the light intensity distribution, the pitch p12 between the microlenses 12-1 is not equal to an integral multiple of the pixel P of the image pickup device 13. Therefore, the number of pixels P allocated to each of the microlenses 12-1 in a predetermined direction changes, and in the image processing section 14, a reconstructed image such as a refocused image or an arbitrary viewpoint image may not be obtained.

On the other hand, in the image pickup apparatus 1 according to the present embodiment, in the microlens array 12, the pitch p12 between the microlenses 12-1 satisfies the above-described formula (11). Thereby, the value of an image height correction factor (corresponding to an inverse of the above-described formula (16)) according to the above-described comparative example is constantly "1". Therefore, in the image pickup data D0 obtained by the image pickup device 13, the occurrence of image height deviation (image height deviation by the image height deviation amount Δ) in the light-sensing plane (a plane on a side closer to the microlens array 12) of the image pickup device 13 is prevented.

As described above, in the present embodiment, the pitch p12 between the microlenses 12-1 satisfies the above-described formula (11). Thus, in the image pickup data D0 obtained by the image pickup device 13, the occurrence of image height deviation in the light-sensing plane of the image pickup device 13 may be prevented. Therefore, when a reconstructed image is formed by the image processing section 14 through the use of such image pickup data D0, an appropriate reconstructed image may be formed in the case where image pickup data is obtained in such a manner as to include information on the traveling direction of light.

Moreover, unlike a second embodiment which will be described below, in the present embodiment, it is not necessary to arrange an image height correction section (an image height correction section 149 which will be described later) performing image height correction, and the present embodiment is achieved only by setting the pitch p12 between the microlenses 12-1, so unless otherwise the position of the aperture stop 10 determined when designing the pitch between the microlenses 12-1 is displaced, an appropriate reconstructed image is formed easily.

Second Embodiment

Next, the second embodiment of the invention will be described below. An image pickup apparatus according to the present embodiment has the same configuration as that of the image pickup apparatus according to the first embodiment, except that the image pickup apparatus according to the present embodiment includes an image processing section 14A which will be described below instead of the image processing section 14 of the image pickup apparatus according to the first embodiment, and that a microlens array (corresponding to the above-described microlens array 102) in which the pitch p12 between the microlenses 12-1 does not satisfy the above-described formula (1) is provided instead of the microlens array 12. Therefore, like components are denoted by like numerals as of the first embodiment, and will not be further described.

Figure 15:
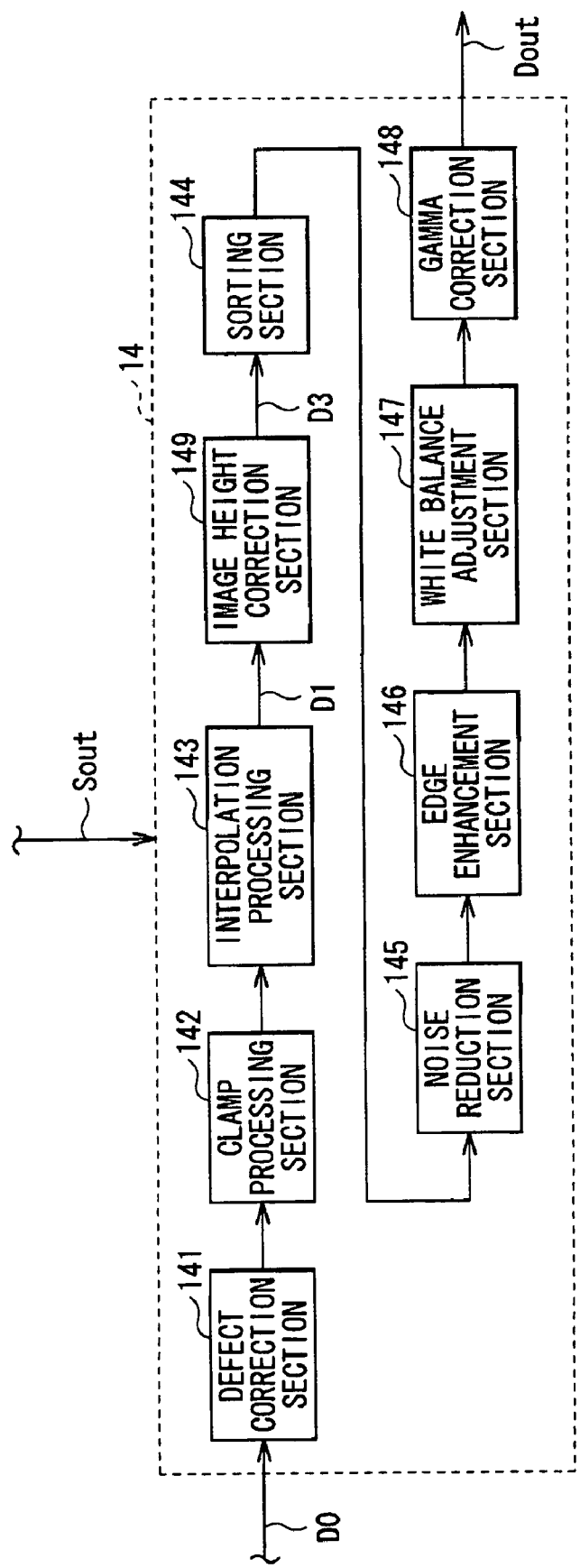
FIG. 15 is a functional block diagram of a configuration example of an image processing section according to a second embodiment of the invention.

FIG. 15 illustrates a functional block diagram of an image processing section (an image processing section 14A) used in the image pickup apparatus according to the present embodiment. The image processing section 14A differs from the image processing section 14 described in the first embodiment, in a configuration that an image height correction section 149 is arranged between the interpolation processing section 143 and the sorting section 144.

The image height correction section 149 performs image height correction on the image pickup data obtained by the image pickup device 13 (more specifically image pickup data D1 obtained by performing interpolation processing by the interpolation processing section 143), so that an image size in a predetermined direction (corresponding to the pitch p12 between the microlenses 12-1) of an image (a unit image) formed on the image pickup device 13 by a single microlens 12-1 is equal to an integral multiple of the pixel size s in the predetermined direction of the pixel P of the image pickup device 13. Thereby, image pickup data D3 is obtained through the image height correction, and the image pickup data D3 is supplied to the sorting section 144. More specifically, the image height correction section 149 performs image height correction on the image pickup data D1 through the use of a correction factor k represented by the following formulas (17) and (18) (the image height correction section 149 obtains the image pickup data D3 by multiplying the image pickup data D1 by the correction factor k). Here, in the case of β=1, p12=m×s is established by the formula (18).

$$k=\beta\{L/(L+f/2)\} \quad (17)$$

$$\beta=(m\times s)/p12 \quad (18)$$

In such a configuration, in the present embodiment, the image height correction section 149 performs the image height correction on the image pickup data D1 so that an image size in a predetermined direction (corresponding to the pitch p12 between the microlenses 12-1) of an image (a unit image) formed on the image pickup device 13 by a single microlens 12-1 is equal to an integral multiple of the pixel size s in the predetermined direction of the pixel P. Thus, in the image pickup data D3 obtained through such image height correction, irrespective of the position of the aperture stop 10 (a distance L between the aperture stop 10 and the microlens array 12), image height deviation (image height deviation by the image height deviation amount Δ) in the light-sensing plane (a plane on a side closer to the microlens array 12) of the image pickup device 13 does not occur. Therefore, when a reconstructed image is formed by the image processing section 14A through the use of image pickup data D3 obtained by performing the image height correction, as in the case of the first embodiment where the image pickup data is obtained so as to include information on the traveling direction of light, an appropriate reconstructed image may be formed irrespective of the position of the aperture stop 10 of the main lens (the image pickup lens 11).

Although the present invention is described referring to the first and second embodiments, the invention is not limited to the embodiments, and may be variously modified.

For example, in the first embodiment, the case where the pitch p12 between the microlenses 12-1 satisfies the above-described formula (11) is described, and in the second embodiment, the case where image height correction is performed by the image height correction section 149 is described. However, for example, the configurations described in the first and second embodiments may be combined. More specifically, the pitch p12 between the microlenses 12-1 may satisfy the above-described formula (11), as well as the image height correction may be performed by the image height correction section 149.

Moreover, in the above-described embodiments, the image processing sections 14 and 14A are described as components of the image pickup apparatus. However, the image processing section is not necessarily arranged in the image pickup apparatus. More specifically, the image processing section may be arranged in an apparatus other than the image pickup apparatus, for example, a PC (Personal Computer) or the like, and image pickup data obtained in the image pickup apparatus may be transferred to the PC to perform image processing on the image pickup data in the PC.

Further, in the above-described embodiments, the aperture stop is arranged on an image side of the image pickup lens (an exit side). However, the invention is not limited to this, and the aperture stop may be arranged on an object side of the image pickup lens (an incident side) or in the image pickup lens.

In the above-described embodiments, as an example of the color filter, the color filter having the Bayer arrangement in which filters of three primary colors, that is, red (R), green (G) and blue (B) are arranged in the checkered pattern at the ratio of R:G:B=1:2:1 is described. However, a color filter having any other arrangement may be used. For example, a color filter (a complimentary filter) having an arrangement in which filters of four complimentary colors, that is, yellow (Y), magenta (M), cyan (C) and green (G) (yellow color filters, magenta color filters, cyan color filters and green color filters) are arranged in a checkered pattern at a ratio of Y:M:C:G=1:1:1:1 may be used.

In the above-described embodiments, a demosaic process is described as an example of the interpolation processing of pixel data in the image pickup data. However, any other interpolation processing may be performed.

In the above-described embodiments, as an example of the image processing including the sorting process performed in the image processing section 14, the refocusing arithmetic processing using the "Light Field Photography" is described. However, the image processing including such a sorting process is not limited to this, and, for example, focus blur processing, depth of field adjustment processing or the like may be used.

It should be understood by those skilled in the art that various modifications, combinations, sub-combinations and alterations may occur depending on design requirements and other factors insofar as they are within the scope of the appended claims or the equivalents thereof.

What is claimed is:

1. An image pickup apparatus comprising:
   an image pickup lens section having an aperture stop;
   an image pickup device obtaining image pickup data on the basis of light detected; and
   a microlens array section arranged on a focal plane of the image pickup lens section between the image pickup lens section and the image pickup device, and including a plurality of microlenses, each of the microlenses being provided corresponding to a plurality of image pickup pixels of the image pickup device,
   wherein the following formula (1) is satisfied:

$$p=(m\times s)\times\{L/(L+f)\} \quad (1)$$

where p is a pitch between the microlenses, s is a pixel size in a predetermined direction, m is the number (an integer) of the image pickup pixels allocated to each of the microlenses in the predetermined direction, L is a distance between the aperture stop and the microlens array section, and f is a focal length of each of the microlenses.

2. The image pickup apparatus according to claim 1, further comprising:
   an image processing section performing predetermined image processing on the image pickup data obtained by the image pickup device.

3. An image pickup apparatus comprising:
   an image pickup lens section having an aperture stop;
   an image pickup device obtaining image pickup data on the basis of light detected;
   a microlens array section arranged on a focal plane of the image pickup lens section between the image pickup lens section and the image pickup device, and including a plurality of microlenses, each of the microlenses being provided corresponding to a plurality of image pickup pixels of the image pickup device; and
   an image height correction section performing image height correction on the image pickup data obtained by the image pickup device so that an image size, in a predetermined direction, of an image formed on the image pickup device by a single microlens is equal to an integral multiple of a pixel size, in the predetermined direction, of the image pickup pixel, wherein
   the image height correction section performs the image height correction on the image pickup data through the use of a correction factor k represented by the following formulas (2) and (3), $$k = \beta \times \{L/(L+f)\} \quad (2)$$

$$\beta = (m \times s)/p \quad (3)$$

where p is a pitch between the microlenses, s is a pixel size in the predetermined direction, m is the number (an integer) of the image pickup pixels allocated to each of the microlenses in the predetermined direction, L is a distance between the aperture stop and the microlens array section, and f is a focal length of each of the microlenses.

4. The image pickup apparatus according to claim 3, further comprising:

an image processing section performing predetermined image processing on corrected image pickup data obtained by the image height correction by the image height correction section.

\* \* \* \* \*